(12) United States Patent
Kim et al.

(10) Patent No.: US 9,530,899 B2
(45) Date of Patent: Dec. 27, 2016

(54) SEMICONDUCTOR MEMORY DEVICE AND METHOD OF MANUFACTURING THE SAME

(71) Applicants: Bi O Kim, Seoul (KR); Jin-Tae Noh, Yongin-si (KR); Su-Jin Shin, Hwaseong-si (KR); Jae-Young Ahn, Seongnam-si (KR); Ki-Hyun Hwang, Seongnam-si (KR)

(72) Inventors: Bi O Kim, Seoul (KR); Jin-Tae Noh, Yongin-si (KR); Su-Jin Shin, Hwaseong-si (KR); Jae-Young Ahn, Seongnam-si (KR); Ki-Hyun Hwang, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 48 days.

(21) Appl. No.: 14/474,942

(22) Filed: Sep. 2, 2014

(65) Prior Publication Data
US 2015/0129954 A1 May 14, 2015

(30) Foreign Application Priority Data
Nov. 12, 2013 (KR) .................. 10-2013-0137004

(51) Int. Cl.
| H01L 29/792 | (2006.01) |
| H01L 27/115 | (2006.01) |
| G11C 16/04 | (2006.01) |
| H01L 21/28 | (2006.01) |
| H01L 29/66 | (2006.01) |

(52) U.S. Cl.
CPC ..... *H01L 29/7926* (2013.01); *H01L 21/28282* (2013.01); *H01L 27/11582* (2013.01); *H01L 29/66833* (2013.01)

(58) Field of Classification Search
None
See application file for complete search history.

(56) References Cited

U.S. PATENT DOCUMENTS

| 8,269,267 B2 | 9/2012 | Arai et al. | |
| 2011/0255334 A1 | 10/2011 | Grossi et al. | |
| 2012/0077320 A1* | 3/2012 | Shim | H01L 27/11582 438/269 |
| 2012/0276702 A1* | 11/2012 | Yang | H01L 27/11582 438/270 |

(Continued)

FOREIGN PATENT DOCUMENTS

| JP | 2011-233623 | 11/2011 |
| KR | 1020120067024 A | 6/2012 |

(Continued)

*Primary Examiner* — Pamela E Perkins
(74) *Attorney, Agent, or Firm* — Myers Bigel, P.A.

(57) ABSTRACT

A semiconductor device and a method of manufacturing the same are provided. The semiconductor device includes insulation layers and gate electrodes alternately stacked on a substrate, a vertical channel vertically passing through the insulation layers and the gate electrodes, and a threshold voltage controlling insulation layer, a tunnel insulation layer and a charge storage layer disposed between the vertical channel and the gate electrodes, wherein the threshold voltage controlling insulation layer is disposed between the charge storage layer and the vertical channel and including a material configured to suppress an inversion layer from being formed in the vertical channel.

15 Claims, 29 Drawing Sheets

(56) References Cited

U.S. PATENT DOCUMENTS

2014/0133238 A1\* 5/2014 Rhie .................. G11C 16/10
365/185.17

FOREIGN PATENT DOCUMENTS

| KR | 1020130006090 A | 1/2013 |
| KR | 1020130014990 A | 2/2013 |
| KR | 1020130070150 A | 6/2013 |
| KR | 1020130070158 A | 6/2013 |

\* cited by examiner

1000A

1000B

SEMICONDUCTOR MEMORY DEVICE AND METHOD OF MANUFACTURING THE SAME

CROSS-REFERENCE TO RELATED APPLICATION

This application claims priority from Korean Patent Application No. 10-2013-0137004 filed on Nov. 12, 2013 in the Korean Intellectual Property Office, and all the benefits accruing therefrom under 35 U.S.C. 119, the contents of which in its entirety are herein incorporated by reference.

BACKGROUND

1. Field of the Invention

The present inventive concept relates to a semiconductor memory device having a vertical channel and a method of manufacturing the same, and more particularly, to a NAND flash memory device having a vertical channel and a method of manufacturing the same.

2. Description of the Related Art

A conventional 2 dimensional (2D) semiconductor memory device includes memory cells arranged in a 2 dimensional (2D) manner and a horizontal channel. Threshold voltages of the 2D memory cells may be controlled by doping the horizontal channel by ion implantation. A three dimensional (3D) semiconductor memory device proposed to increase the integration density of a semiconductor device includes memory cells vertically stacked and a vertical channel. The vertical channel may be structurally difficult to be doped by ion implantation, as compared to the horizontal channel.

SUMMARY

The present inventive concept provides a semiconductor memory device having an improved program margin by increasing a threshold voltage of a semiconductor memory cell having a vertical channel.

The present inventive concept also provides a method of manufacturing a semiconductor memory device having an improved program margin by increasing a threshold voltage of a semiconductor memory cell having a vertical channel.

These and other objects of the present inventive concept will be described in or be apparent from the following description of the embodiments.

According to an aspect of the present inventive concept, there is provided a semiconductor device including insulation layers and gate electrodes alternately stacked on a substrate, a vertical channel vertically passing through the insulation layers and the gate electrodes, and a threshold voltage controlling insulation layer, a tunnel insulation layer and a charge storage layer disposed between the vertical channel and the gate electrodes, wherein the threshold voltage controlling insulation layer is disposed between the charge storage layer and the vertical channel and comprises a material configured to suppress an inversion layer from being formed in the vertical channel.

According to another aspect of the present inventive concept, there is provided a semiconductor memory device including insulation layers and gate electrodes alternately stacked on a substrate, a vertical channel vertically passing through the insulation layers and the gate electrodes, a tunnel insulation layer and a charge storage layer disposed between the vertical channel and the gate electrodes, a filling insulation layer filling the inside of the vertical channel, and a threshold voltage controlling insulation layer disposed between the filling insulation layer and the vertical channel, wherein the threshold voltage controlling insulation layer comprises a material configured to suppress an inversion layer from being formed in the vertical channel.

According to still another aspect of the present inventive concept, there is provided a semiconductor memory device including a plurality of insulation layers and a plurality of gate electrodes alternately stacked on a substrate, a vertical channel passing through the plurality of insulation layers and the plurality of gate electrodes, a tunnel insulation layer and a charge storage layer disposed between the vertical channel and the plurality of gate electrodes, and a threshold voltage controlling insulation layer disposed to be closer to the vertical channel than to the charge storage layer and suppressing an inversion layer from being formed in the vertical channel.

According to still another aspect of the present inventive concept, there is provided a semiconductor memory device including a plurality of insulation layers and a plurality of gate electrodes alternately stacked on a substrate, a channel hole passing through the plurality of insulation layers and the plurality of gate electrodes, a vertical channel formed in the channel hole, a tunnel insulation layer and a charge storage layer formed on one surface of the vertical channel in the channel hole, and a threshold voltage controlling insulation layer formed on the other surface of the vertical channel in the channel hole and configured to suppress an inversion layer from being formed in the vertical channel.

As described above, in the semiconductor memory device having a vertical channel according to the inventive concept, the threshold voltage controlling insulation layer is disposed to be close to the vertical channel, thereby increasing a threshold voltage of the semiconductor memory device by suppressing an inversion layer from being formed in the vertical channel. Accordingly, the semiconductor memory device may have an improved program margin.

BRIEF DESCRIPTION OF THE DRAWINGS

The above and other features and advantages of the present inventive concept will become more apparent by describing in detail embodiments thereof with reference to the attached drawings in which.

DETAILED DESCRIPTION OF THE EMBODIMENTS

Figure 1:
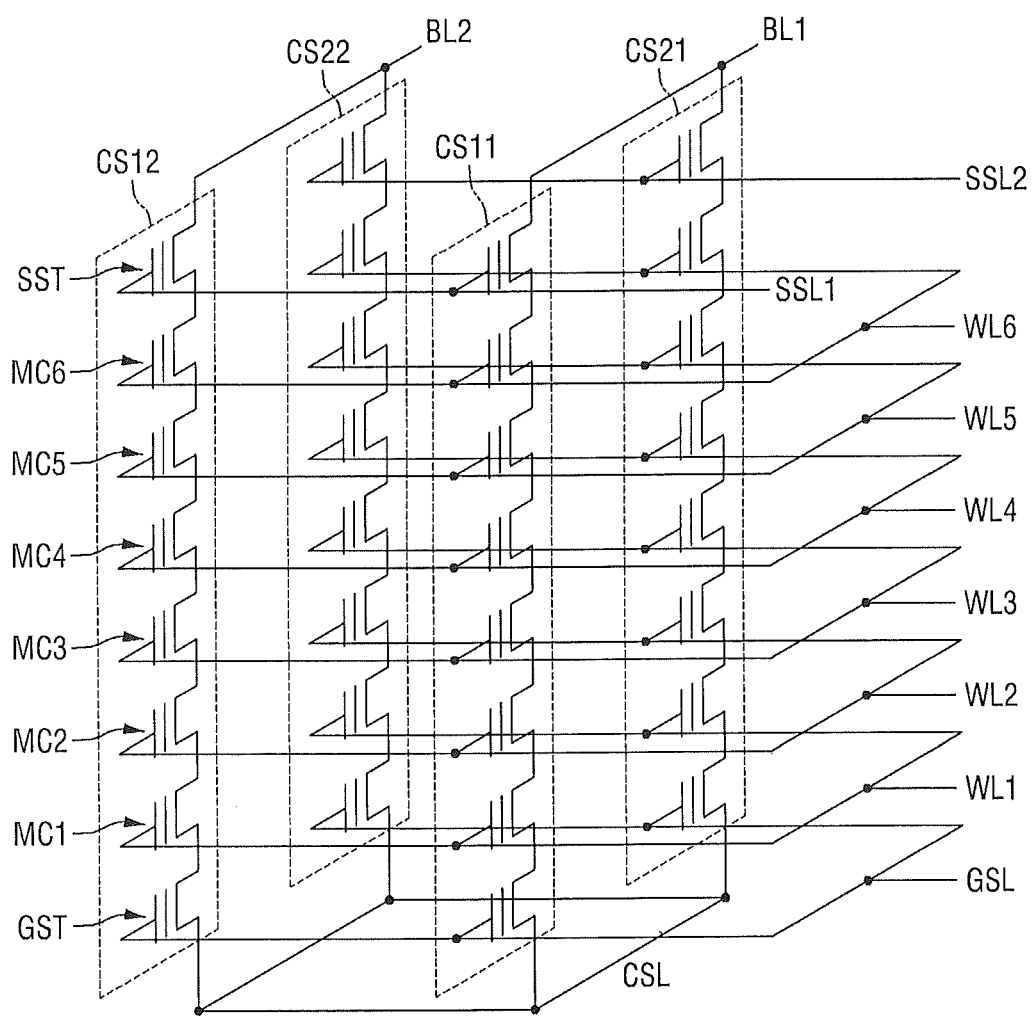
FIG. 1 is an equivalent circuit view of a memory cell array of semiconductor devices according to some embodiments of the inventive concept.

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is an equivalent circuit view of a memory cell array of semiconductor devices according to some embodiments of the inventive concept.

Referring to FIG. 1, the memory cell array 10 may include a plurality of cell strings CS11, CS12, CS21 and CS22 extending in a vertical direction.

Each of the cell strings CS11, CS12, CS21 and CS22 may include a ground select transistor GST, a plurality of memory cell transistors MC1, MC2, and MC6 and a string select transistor SST, which are connected in series. In FIG. 1, each of the cell strings CS11, CS12, CS21 and CS22 having a ground select transistor GST and a string select transistor SST is exemplified. However, each of the cell strings CS11, CS12, CS21 and CS22 may have two or more ground select transistors GSTs and/or two or more string select transistors SSTs. In addition, each of the cell strings CS11, CS12, CS21 and CS22 having six memory cell transistors MC1, MC2, and MC6 is exemplified. However, each of the cell strings CS11, CS12, CS21 and CS22 may have eight or more memory cell transistors MC1, MC2, and MC6.

The plurality of cell strings CS11, CS12, CS21 and CS22 may be connected on a column or row basis. The string select transistor SST of each of the cell strings CS11, CS12, CS21 and CS22 may be connected to corresponding bit lines BL1 and BL2. For example, the cell strings CS11 and CS21 commonly connected to the first bit line BL1 may constitute a first column, and the cell strings CS12 and CS22 commonly connected to the second bit line BL2 may constitute a second column. In addition, the string select transistor SST of each of the cell strings CS11, CS12, CS21 and CS22 may be connected to the string select lines SSL1 and SSL2. For example, the cell strings CS11 and CS12 commonly connected to the first string select line SSL1 may constitute a first row, and the cell strings CS21 and CS22 commonly connected to the second string select line SSL2 may constitute a second row.

The ground select transistors GST of the cell strings CS11, CS12, CS21 and CS22 are connected by a ground select line GSL. A common source line CSL may be connected to the ground select transistor GST of each of the cell strings CS11, CS12, CS21 and CS22.

The memory cell transistors MC1, MC2, and MC6 positioned at the same height may be connected to the same word lines WL1, WL2, . . . , and WL6, respectively. For example, the first memory cell transistor MC1 connected to the ground select transistor GST may be connected to the first memory cell transistor MC1 of an adjacent row through the first word line WL1.

Figure 2A:
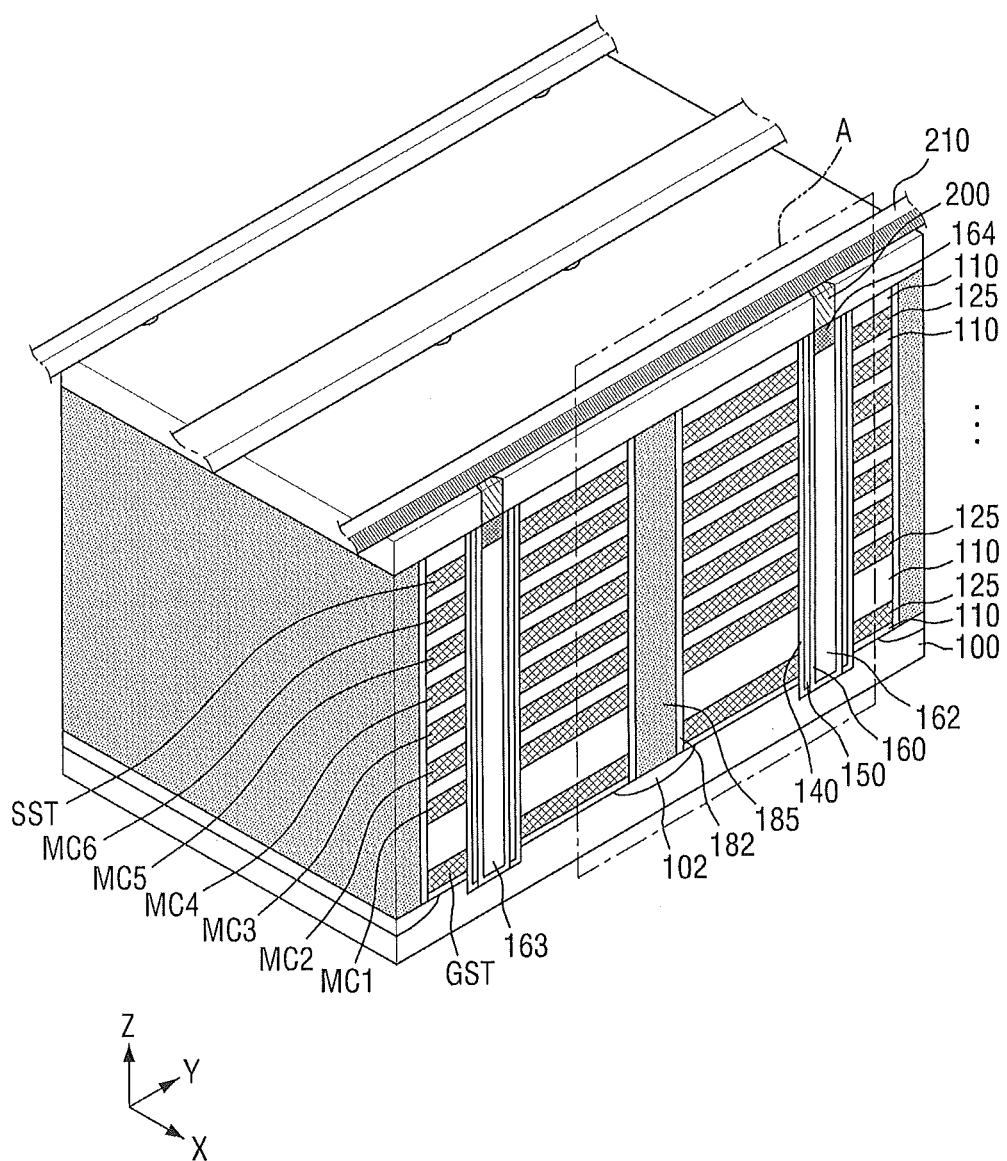
FIG. 2A is a perspective view of semiconductor devices according to some embodiments of the inventive concept.
Figure 2B:
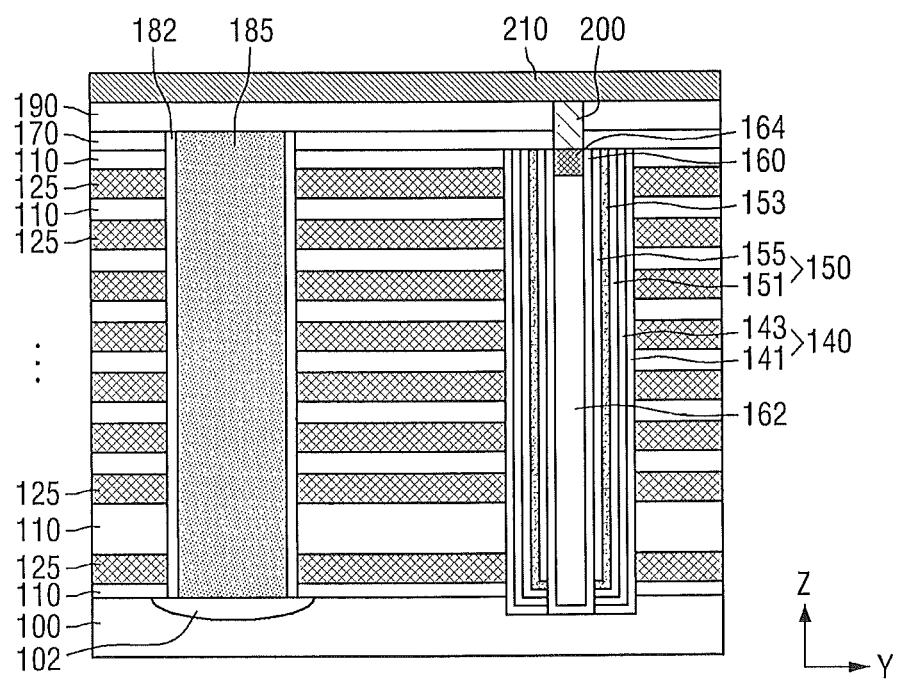
FIG. 2B is an enlarged view illustrating a portion 'A' of FIG. 2A, illustrating a cross sectional view of a semiconductor device according to a first embodiment of the present inventive concept.

FIG. 2A is a perspective view of semiconductor devices according to some embodiments of the inventive concept, FIG. 2B is an enlarged view illustrating a portion 'A' of FIG. 2A, illustrating a cross sectional view of a semiconductor device according to a first embodiment of the present inventive concept.

Referring to FIG. 2A, a semiconductor device 1000 may include insulation layers 110 and gate electrodes 125 alternately stacked on a substrate 100, a charge storage layer 140, a tunnel insulation layer 150 and a vertical channel 160.

The substrate 100 may include a silicon substrate, a germanium substrate, a silicon-germanium substrate, a silicon on insulator (SOI), and so on.

The charge storage layer 140 may include a plurality of layers and the tunnel insulation layer 150 may include a plurality of layers. The charge storage layer 140 and the tunnel insulation layer 150 will be described in detail with reference to FIGS. 2B and 2C.

A plurality of impurity regions 102 extending in a first direction X and spaced apart from each other in a second direction Y perpendicular to the first direction X may be provided in the substrate 100. A plurality of cylindrical vertical channels 160 extending in a third direction Z perpendicular to the first direction X and the second direction Y may be formed on the substrate 100 between adjacent ones of the plurality of impurity regions 102.

The vertical channels 160 may include silicon. A filling insulation layer 162 may be formed in each of the vertical channels 160. The filling insulation layer 162 may include an insulating material, such as silicon oxide, silicon oxynitride or silicon nitride. A charge storage layer 140 and a tunnel insulation layer 150 may be formed on an outer wall of each of the vertical channels 160. A channel pad 164 may be formed on sidewalls of the vertical channels 160 and on the filling insulation layer 162. The channel pad 164 may include silicon doped with an impurity such as boron (B).

A bottom surface of each of the vertical channels 160 makes contact with the substrate 100 to be electrically connected thereto. The plurality of gate electrodes 125 may be spaced apart from each other in the third direction Z along outer walls of the vertical channels 160, the tunnel insulation layer 150 and the charge storage layer 140. Among the plurality of gate electrodes 125, the bottommost gate electrode may be used as a ground select gate electrode and may function as a ground select line (GSL) of FIG. 1. The topmost gate electrode may be used as a string select gate electrode and may function as a string select line (SSL1, SSL2) of FIG. 1, and gate electrodes positioned between the ground select gate electrode and the string select gate electrode may be used as cell gate electrodes and may function as word lines WL1, WL2, and WL6) of FIG. 1. The plurality of gate electrodes 125 may include a conductive material such as tungsten, copper or metal silicide.

An insulation layer 110 may be interposed between the gate electrodes 125 and between the bottommost gate electrode and the substrate. The insulation layer 110 may be formed on the topmost gate electrode. The insulation layer 110 may include an insulating material, such as silicon oxide, silicon oxynitride or silicon nitride.

A common source line 185 may be formed to extend in the first direction X on the impurity regions 102. An insulation spacer 182 is formed on both sidewalls of the common source line 185, thereby electrically insulating the plurality of gate electrodes 125 and the common source line 185 from each other.

A contact pad 200 is formed on the channel pad 164 and a bit line 210 extending in the second direction Y is formed on the contact pad 200.

The memory cell arrays shown in FIGS. 1 and 2A are provided only for illustration, but the number of word lines WLx, the number of string select lines SSLx, and the number of ground select lines GSLx are not limited to those illustrated herein. For example, two or more string select lines SSLx may be sequentially formed in the second direction Y, or two or more ground select lines GSLx may be sequentially formed in the second direction Y. In addition, various numbers, for example, 8, 16, 32, etc. of word lines WLx may be formed. Further, the number of cell strings CSxy connected to the bit line BL is not limited to that shown in FIGS. 1 and 2A, but various numbers of cell strings CSxy may be formed according to the design of memory cell array.

Referring further to FIG. 2B, in a semiconductor device 1000A according to a first embodiment of the inventive concept, a tunnel insulation layer 150 and a charge storage layer 140 may be formed on outer walls of a vertical channel 160. A threshold voltage controlling insulation layer 153 may be disposed in the tunnel insulation layer 150. That is to say, the tunnel insulation layer 150 may include a first gate insulation layer 151 and a second gate insulation layer 155. The threshold voltage controlling insulation layer 153 may be positioned between the first gate insulation layer 151 and the second gate insulation layer 155. The charge storage layer 140 may be formed between the plurality of gate electrodes 125 and the tunnel insulation layer 150. The charge storage layer 140 may include a charge trap layer 143 and a blocking layer 141. The second gate insulation layer 155, the threshold voltage controlling insulation layer 153, the first gate insulation layer 151, the charge trap layer 143 and the blocking layer 141 may be sequentially arranged on the outer walls of the vertical channel 160 toward the plurality of gate electrodes 125.

Accordingly, the threshold voltage controlling insulation layer 153 is positioned between the vertical channel 160 and the charge trap layer 143.

The filling insulation layer 162 and the channel pad 164 may be formed within the vertical channel 160. The channel pad 164 may make direct contact with upper portions of the sidewalls of the vertical channel 160 to then be electrically connected.

In the semiconductor device 1000A according to the first embodiment of the inventive concept, the threshold voltage controlling insulation layer 153 formed to be adjacent to the vertical channel 160 suppresses an inversion layer from being formed in the vertical channel 160, thereby increasing a threshold voltage of the semiconductor memory device 1000A and improving a program margin.

Meanwhile, in FIG. 2B, the threshold voltage controlling insulation layer 153 disposed within the tunnel insulation layer 150 is exemplified, but aspects of the present inventive concept are not limited thereto. For example, the threshold voltage controlling insulation layer 153 may be formed to make direct contact with the vertical channel 160.

As shown in FIG. 2B, the threshold voltage controlling insulation layer 153 may be divided into two parts by the vertical channel 160. As will later be described with regard to a manufacturing method (see FIG. 3D), after forming the threshold voltage controlling insulation layer 153, a portion of the threshold voltage controlling insulation layer 153 is removed by anisotropic etching.

Figure 2C:
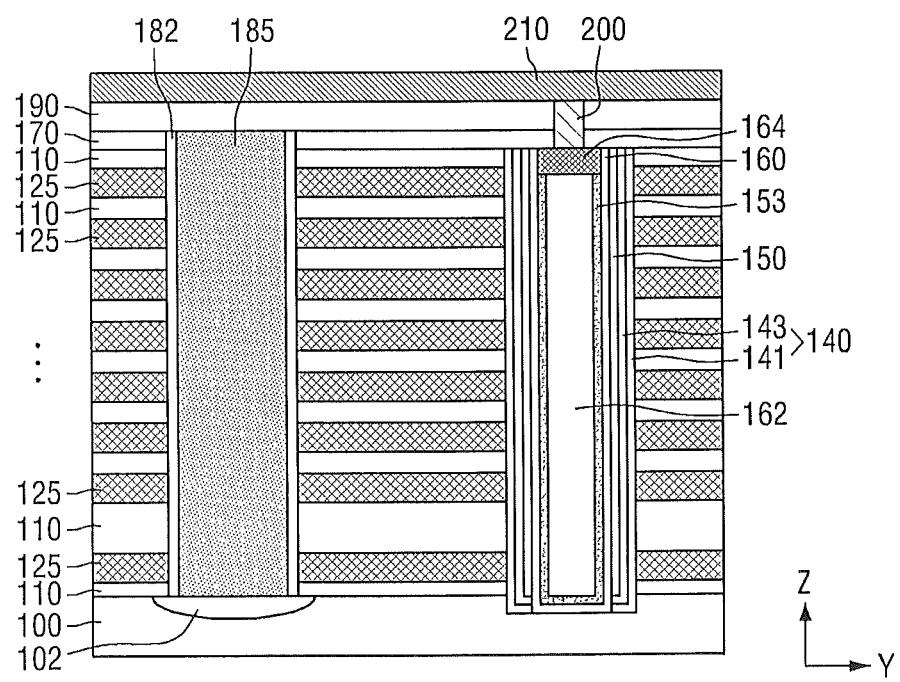
FIG. 2C is an enlarged view illustrating a portion 'A' of FIG. 2A, illustrating a cross sectional view of a semiconductor device according to a second embodiment of the present inventive concept.

FIG. 2C is an enlarged view illustrating a portion 'A' of FIG. 2A, illustrating a cross sectional view of a semiconductor device according to a second embodiment of the present inventive concept. For the sake of convenient explanation, the following description will focus on differences between the present embodiment and the previous embodiment shown in FIGS. 2A and 2B.

Referring to FIG. 2C, in the semiconductor device 1000B according to the second embodiment of the inventive concept, a tunnel insulation layer 150 and a charge storage layer 140 may be formed on outer walls of a vertical channel 160. The tunnel insulation layer 150 may include a gate insulation layer. The charge storage layer 140 may be formed between a plurality of gate electrodes 125 and the tunnel insulation layer 150. The charge storage layer 140 may include a charge trap layer 143 and a blocking layer 141.

A threshold voltage controlling insulation layer 153 is formed on inner walls of a vertical channel 160, and the inside of the threshold voltage controlling insulation layer 153 may be filled with the filling insulation layer 162. The channel pad 164 may be formed on sidewalls of the vertical channel 160, the threshold voltage controlling insulation layer 153 and the filling insulation layer 162 and may make direct contact with upper portions of the sidewalls of the vertical channel 160 to then be electrically connected.

As shown in FIG. 2C, the tunnel insulation layer 150 and the charge storage layer 140 are formed on one side surface of the vertical channel 160, and the threshold voltage controlling insulation layer 153 is formed on the other side surface of the vertical channel 160. The threshold voltage controlling insulation layer 153 may be formed to make direct contact with the vertical channel 160. As described above, because the threshold voltage controlling insulation layer 153 is formed to be very close to the vertical channel 160, it can suppress an inversion layer from being formed in the vertical channel 160, thereby increasing a threshold voltage of the semiconductor memory device 1000B.

In addition, the vertical channel 160 may be conformally formed along sidewalls and bottom surface of a channel hole. The threshold voltage controlling insulation layer 153 may be conformally formed along the vertical channel 160. Therefore, the threshold voltage controlling insulation layer 153 may be formed along sidewalls and the bottom surface of the channel hole.

FIGS. 3A to 3J are cross sectional views illustrating a method for manufacturing a semiconductor device according to a first embodiment of the inventive concept as shown in FIG. 2B.

Figure 3A:
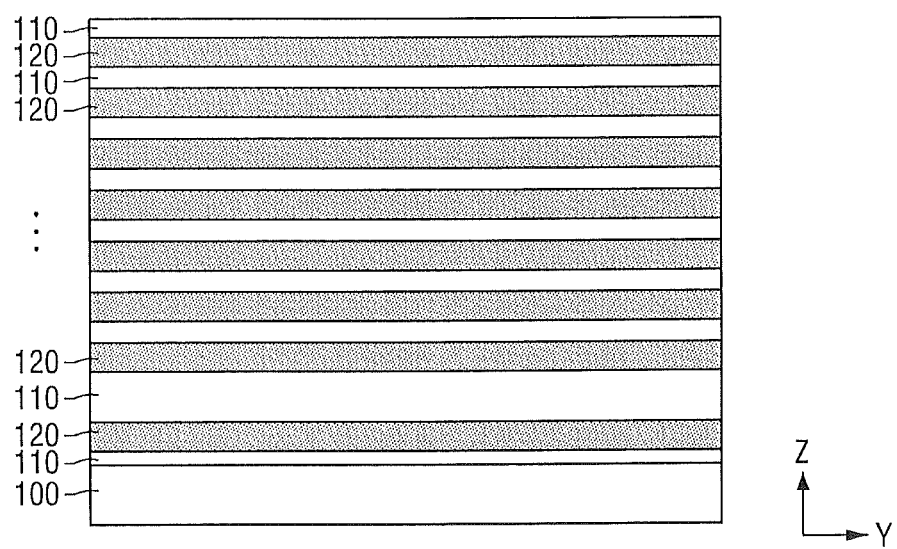
FIGS. 3A to 3J are cross sectional views illustrating a method for manufacturing a semiconductor device according to a first embodiment of the inventive concept.

Referring to FIG. 3A, a plurality of insulation layers 110 and a plurality of sacrificial layers 120 are alternately repeatedly stacked on the substrate 100. Accordingly, the plurality of insulation layers 110 and the plurality of sacrificial layers 120 may be alternately stacked in the third direction Z. The substrate 100 may include a semiconductor material, such as silicon, germanium, or the like.

The sacrificial layers 120 may be formed using materials having etching selectivity with respect to the insulation layers 110. For example, when the insulation layers 110 are formed using silicon oxide, silicon oxynitride or silicon nitride, the sacrificial layers 120 may include silicon, silicon carbide, silicon oxide or silicon nitride, which are different from the materials for forming the insulation layers 110.

Thicknesses of the plurality of sacrificial layers 120 may not be equal to each other. For example, the bottommost sacrificial layer and the topmost sacrificial layer may be thicker than the other sacrificial layers. In addition, thicknesses of the plurality of insulation layers 110 may not be equal to each other. For example, the bottommost insulation layer may be thinner than the other insulation layers.

In a subsequent process, the sacrificial layers 120 are removed to then be converted into gates of transistors. Therefore, the number of the plurality of insulation layers 110 and the sacrificial layers 120 stacked may increase or decrease according to the number of transistors stacked.

Figure 3B:
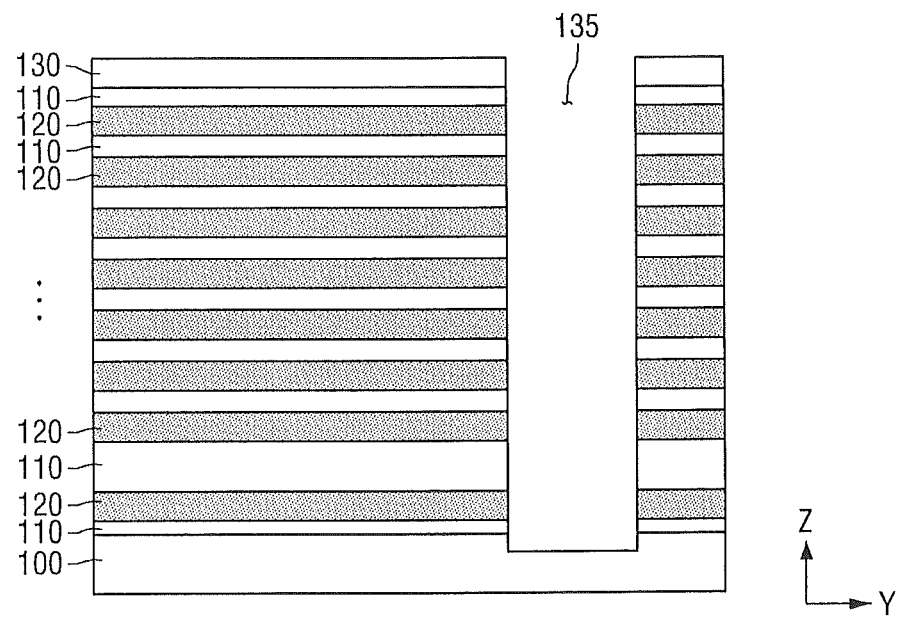

Referring to FIG. 3B, a channel hole 135 passing through the plurality of insulation layers 110 and the sacrificial layers 120 is formed to expose the substrate 100. The forming of the channel hole 135 includes forming a first mask pattern 130 on the topmost insulation layer and sequentially anisotropically etching the plurality of insulation layers 110 and the sacrificial layers 120 using the first mask pattern 130 as an etch mask until a top surface of the substrate 100 is exposed. In the anisotropic etching, the surface of the substrate 100 in the channel hole 135 may be recessed to a predetermined depth by overetch. The channel hole 135 may be formed in a hole type configuration. Referring to FIG. 3B together with FIG. 2A, the channel hole 135 may be formed in a zigzag configuration in the first direction X. The first mask pattern 130 may include a photoresist. The first mask pattern 130 may be removed in a later process.

Figure 3C:
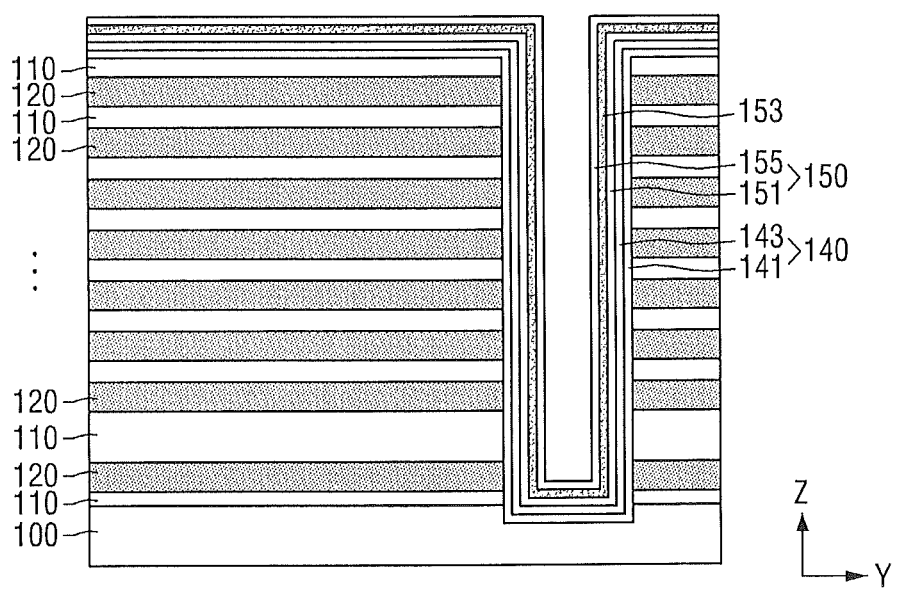

Referring to FIG. 3C, the charge storage layer 140 and the tunnel insulation layer 150 are formed on the topmost insulation layer and the sidewalls of the channel hole 135 and on the substrate 100 exposed in the channel hole 135. The charge storage layer 140 may include a blocking layer 141 and a charge trap layer 143. The threshold voltage controlling insulation layer 153 may be disposed in the tunnel insulation layer 150. The first gate insulation layer 151 and the second gate insulation layer 155 may be disposed at both sides of the threshold voltage controlling insulation layer 153. Therefore, a blocking layer 141, a charge trap layer 143, a first gate insulation layer 151, a threshold voltage controlling insulation layer 153 and a second gate insulation layer 155 may be sequentially formed on the topmost insulation layer and the sidewalls of the channel hole 135 and the substrate 100 exposed in the channel hole 135. The blocking layer 141 may include silicon oxide or metal oxide, the charge trap layer 143 may include silicon nitride, the first and second gate insulation layers 151 and 155 may include silicon oxide or nitrogen doped silicon oxide, and the threshold voltage controlling insulation layer 153 may include a material capable of suppressing an inversion layer from being formed in the vertical channel 160, for example, an aluminum oxide layer. Aluminum atoms contained in an aluminum oxide layer move to the vertical channel 160 to then bond with silicon, thereby forming a negative fixed charge. The negative fixed charge may suppress an inversion layer from being formed in the vertical channel 160. Therefore, the threshold voltage controlling insulation layer 153 may be formed to be close to the vertical channel 160. Accordingly, the threshold voltage controlling insulation layer 153 may be disposed between the charge trap layer 143 and the vertical channel 160.

Figure 3D:
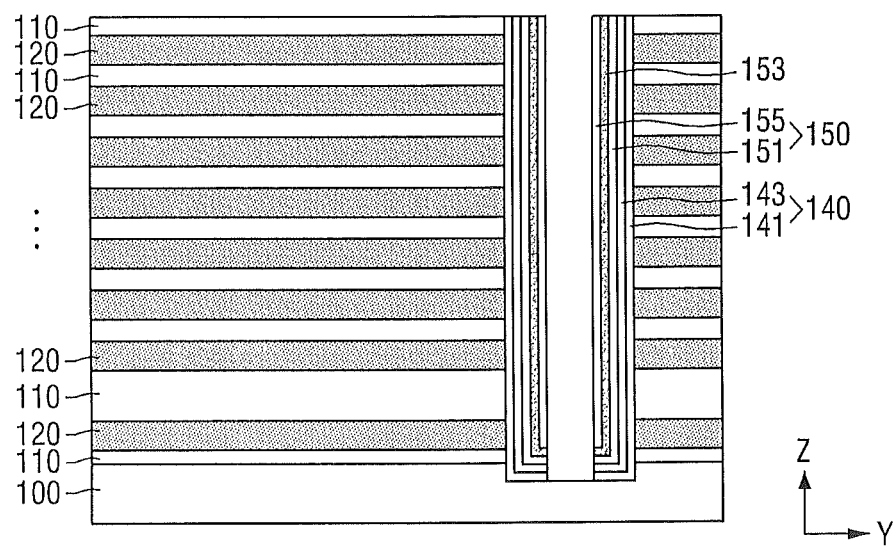

Referring to FIG. 3D, the blocking layer 141, the charge trap layer 143, the first gate insulation layer 151, the threshold voltage controlling insulation layer 153 and the second gate insulation layer 155, which are formed on the topmost insulation layer 110 and the substrate 100, are removed by, for example, anisotropic etching. Accordingly, the blocking layer 141, the charge trap layer 143, the first gate insulation layer 151, the threshold voltage controlling insulation layer 153 and the second gate insulation layer 155 are formed on the sidewalls of the channel hole 135 in spacer types, and a portion of the substrate 100 may be exposed.

Figure 3E:
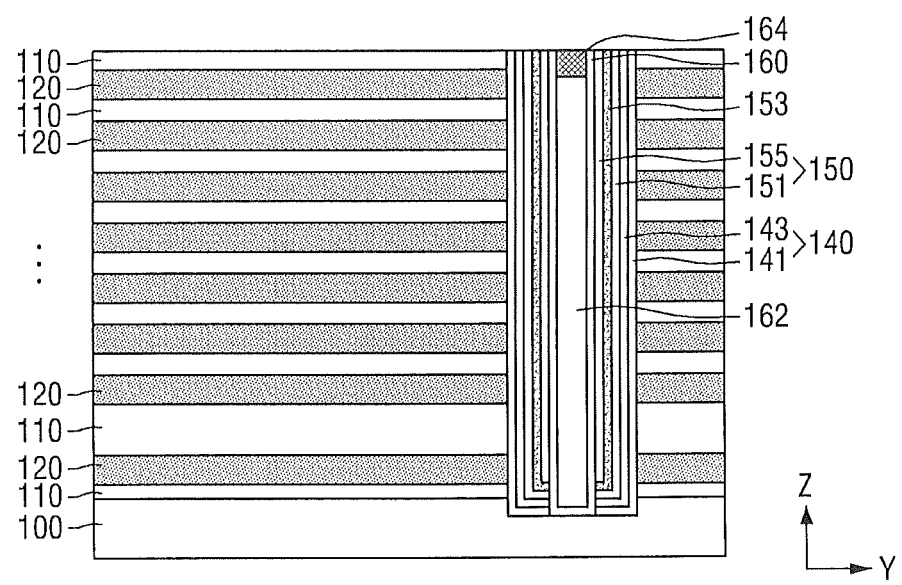

Referring to FIG. 3E, the vertical channel 160 is formed on the second gate insulation layer 155 and the substrate 100 exposed in channel hole 135. The blocking layer 141, the charge trap layer 143, the first gate insulation layer 151, the threshold voltage controlling insulation layer 153, the second gate insulation layer 155 and the vertical channel 160 may be sequentially formed on the sidewalls of the channel hole 135. The vertical channel 160 may include an undoped polysilicon layer or a polysilicon doped with n-type impurity. In addition, the filling insulation layer 162 is formed in the vertical channel 160, and the channel pad 164 filling an upper portion of the channel hole 135 may be formed on the sidewalls of the vertical channel 160 and on the filling insulation layer 162.

Figure 3F:
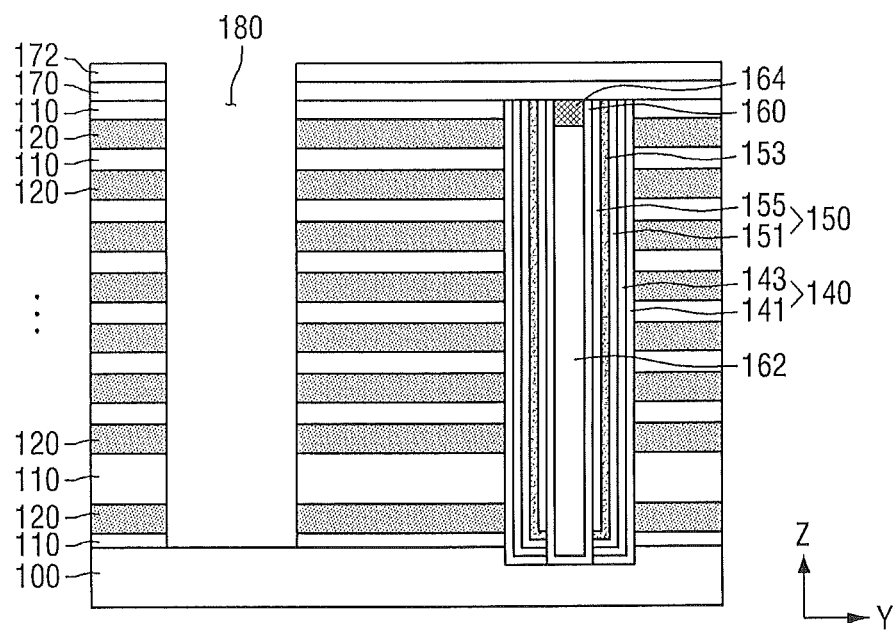

Referring to FIG. 3F, a first interlayer dielectric layer 170 is formed on the topmost insulation layer 110 and the channel pad 164, and a trench 180 exposing the substrate 100 may be formed by anisotropically etching the first interlayer dielectric layer 170 between adjacent vertical channels 160, the plurality of insulation layers 110 and the sacrificial layers 120. The forming of the trench 180 may include forming a second mask pattern 172 on the first interlayer dielectric layer 170 and forming the trench 180 by anisotropically etching using the second mask pattern 172 as an etch mask until a top surface of the substrate 100 is exposed, the trench 180 vertically passing through the plurality of insulation layers 110 and the sacrificial layers 120 and extending in the first direction X.

Side surfaces of the first interlayer dielectric layer 170, the plurality of insulation layers 110 and the sacrificial layers 120 may be exposed in the trench 180. The second mask pattern 172 may include photoresist. The second mask pattern 172 may be removed in a later process.

Figure 3G:
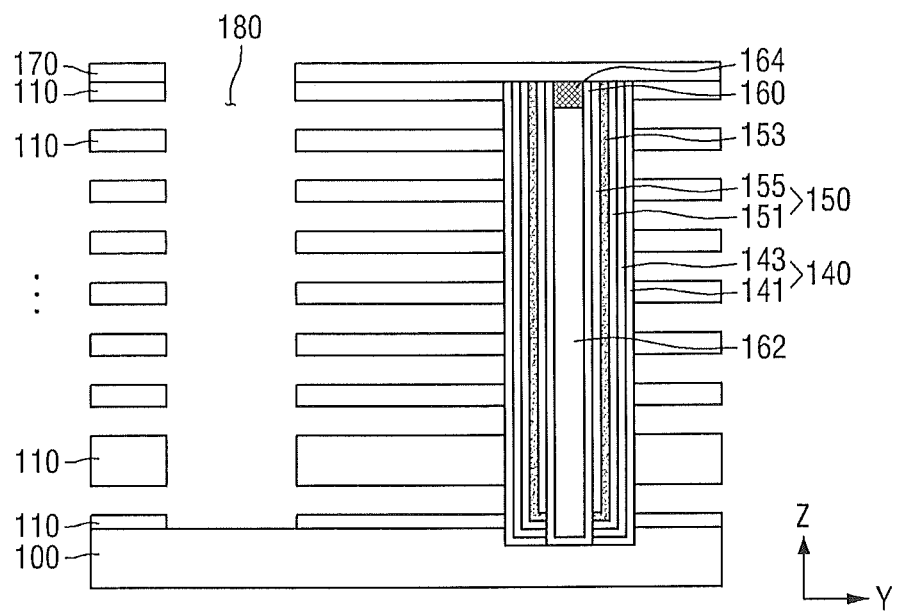

Referring to FIG. 3G, the plurality of sacrificial layers 120 exposed on the sidewalls of the trench 180 are removed. Accordingly, the charge storage layer 140 may be exposed in regions from which the plurality of sacrificial layers 120 are removed. When the plurality of sacrificial layers 120 include silicon nitride or silicon oxynitride, they may be removed using an etching solution containing phosphoric acid.

Figure 3H:
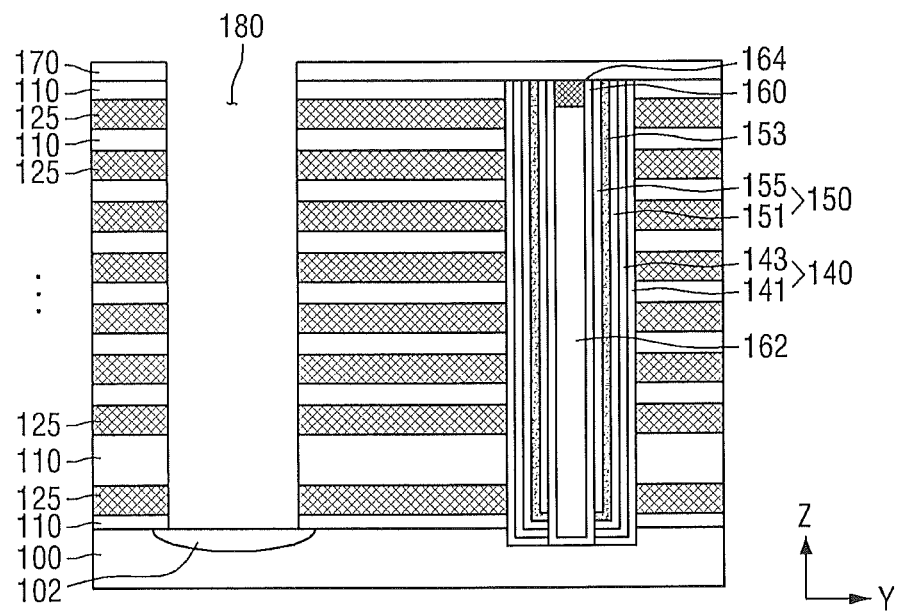

Referring to FIG. 3H, a conductive material is applied to the regions from which the plurality of sacrificial layers 120 are removed. The conductive material may include a metal, metal silicide or a combination thereof. For example, the conductive material may include tungsten, aluminum, copper, or metal silicide.

Thereafter, high-concentration impurity ions may be provided to the substrate 100 exposed in the trench 180, thereby forming impurity regions 102. For example, the providing of the high-concentration impurity ions may include implanting n-type impurity ions, such as phosphorus (P) or arsenic (As) into the substrate 100 on a bottom of the trench 180.

Figure 3I:
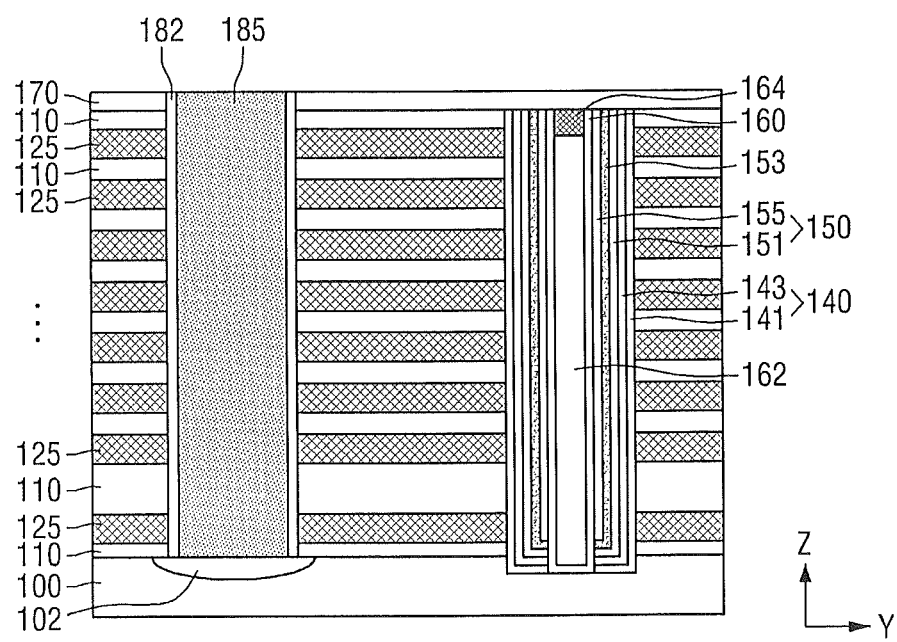

Referring to FIG. 3I, an insulation spacer 182 is formed on inner walls of the trench 180. For example, the forming of the insulation spacer 182 may include forming an insulating material on the sidewalls of the trench 180, the substrate 100 exposed on a bottom of the trench 180 and on the first interlayer dielectric layer 170, and removing the insulating material by performing an anisotropic etching process to expose a top surface of the substrate 100 on the bottom of the trench 180.

Thereafter, the common source line 185 filling the trench 180 is formed on the insulation spacer 182. For example, the forming of the common source line 185 may include forming a conductive material on the entire surface of the insulation spacer 182, the substrate 100 exposed on the bottom of the trench 180 and the first interlayer dielectric layer 170 and then planarizing the conductive material to expose a top surface of the first interlayer dielectric layer 170. The common source line 185 may be electrically connected to the impurity regions 102 of the substrate 100 and may extend in the first direction X. The common source line 185 may include a metal, metal silicide or a combination thereof. For example, the common source line 185 may include tungsten, aluminum, copper, or metal silicide.

Figure 3J:
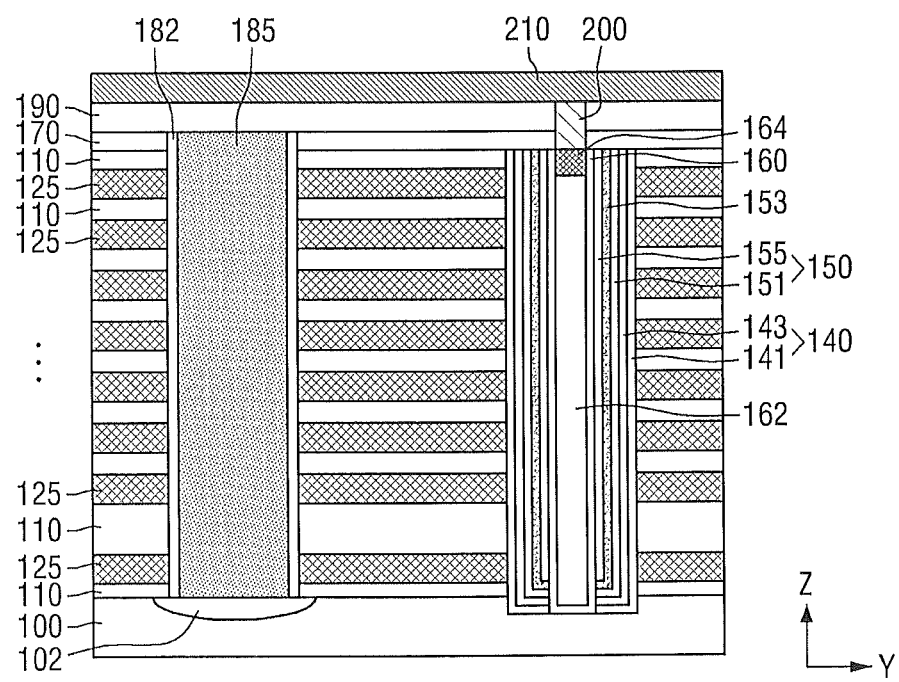

Referring to FIG. 3J, a second interlayer dielectric layer 190 is formed on the first interlayer dielectric layer 170, the insulation spacer 182 and the common source line 185, and a contact pad 200 is formed, the contact pad 200 passing through the first interlayer dielectric layer 170 and the second interlayer dielectric layer 190 and electrically connected to the channel pad 164.

Thereafter, a bit line 210 for connection of the contact pad 200 may be formed on the second interlayer dielectric layer 190. The bit line 210 may be shaped as a line extending in the second direction Y. The contact pad 200 and the bit line 210 may include a conductive material, such as copper (Cu), tungsten (W), or aluminum (Al).

In the method of manufacturing the semiconductor memory device having a vertical channel, the tunnel insulation layer 150 including the threshold voltage controlling insulation layer 153 is formed between the gate electrode 125 and the vertical channel 160, thereby increasing a threshold voltage of the semiconductor memory device. Accordingly, a program margin of the semiconductor memory device can be improved.

FIGS. 4A to 4K are cross sectional views illustrating a method for manufacturing a semiconductor device according to a second embodiment of the inventive concept.

Figure 4A:
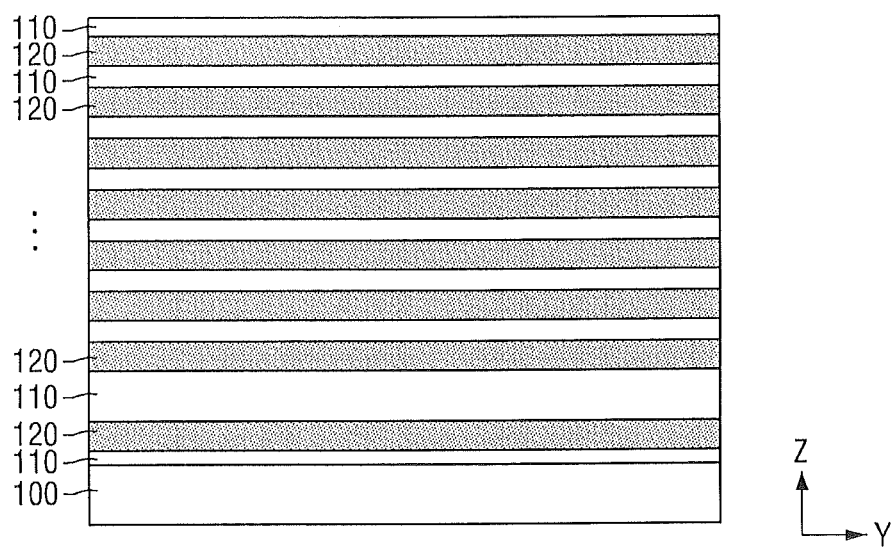
FIGS. 4A to 4K are cross sectional views illustrating a method for manufacturing a semiconductor device according to a second embodiment of the inventive concept.

Referring to FIG. 4A, a plurality of insulation layers 110 and a plurality of sacrificial layers 120 are alternately repeatedly stacked on a substrate 100. Accordingly, the plurality of insulation layers 110 and the plurality of sacrificial layers 120 may be alternately stacked in the third direction Z. The substrate 100 may include a semiconductor material, such as silicon, germanium, or the like.

The sacrificial layers 120 may be formed using materials having an etching selectivity with respect to the insulation layers 110. For example, when the insulation layers 110 are formed using silicon oxide, silicon oxynitride or silicon nitride, the sacrificial layers 120 may include silicon, silicon carbide, silicon oxide or silicon nitride, which are different from the materials for forming the insulation layers 110.

Thicknesses of the plurality of sacrificial layers 120 may not be equal to each other. For example, the bottommost sacrificial layer and the topmost sacrificial layer may be thicker than the other sacrificial layers. In addition, thicknesses of the plurality of insulation layers 110 may not be equal to each other. For example, the bottommost insulation layer may be thinner than the other insulation layers.

In a subsequent process, the sacrificial layers 120 are removed to then be converted into gates of transistors. Therefore, the number of the plurality of insulation layers 110 and the sacrificial layers 120 stacked may increase or decrease according to the number of transistors stacked.

Figure 4B:
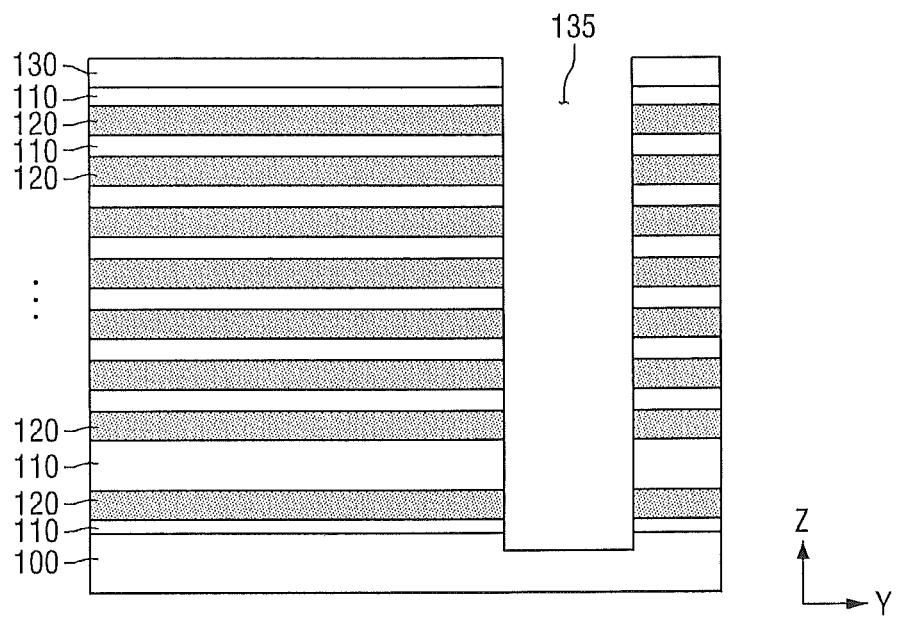

Referring to FIG. 4B, a channel hole 135 passing through the plurality of insulation layers 110 and the sacrificial layers 120 is formed to expose the substrate 100. The forming of the channel hole 135 includes forming a first mask pattern 130 on the topmost insulation layer and sequentially anisotropically etching the plurality of insulation layers 110 and the sacrificial layers 120 using the first mask pattern 130 as an etch mask until a top surface of the substrate 100 is exposed. In the anisotropic etching, the surface of the substrate 100 in the channel hole 135 may be recessed to a predetermined depth by overetch. The channel hole 135 may be formed in a hole type configuration. Referring to FIG. 4B together with FIG. 2A, the channel hole 135 may be formed in a zigzag configuration in the first direction X. The first mask pattern 130 may include a photoresist. The first mask pattern 130 may be removed in a later process.

Figure 4C:
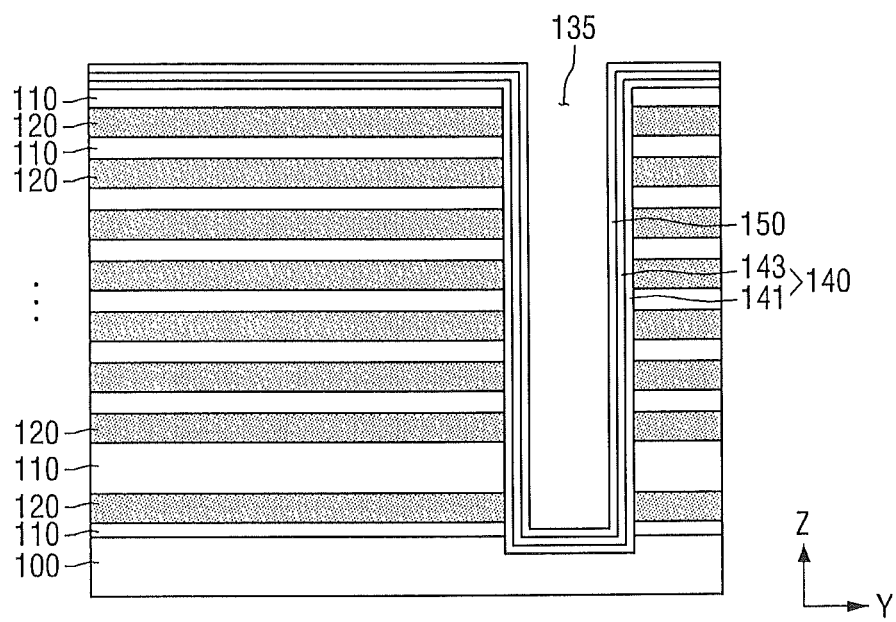

Referring to FIG. 4C, the charge storage layer 140 and the tunnel insulation layer 150 are formed on the topmost insulation layer and the sidewalls of the channel hole 135 and on the substrate 100 exposed in the channel hole 135. The charge storage layer 140 may include a blocking layer 141 and a charge trap layer 143. The tunnel insulation layer 150 may include a gate insulation layer. Therefore, the blocking layer 141, the charge trap layer 143 and the tunnel insulation layer 150 may be sequentially formed on the topmost insulation layer and the sidewalls of the channel hole 135 and the substrate 100 exposed in the channel hole 135. The blocking layer 141 may include silicon oxide or metal oxide, the charge trap layer 143 may include silicon nitride, and the tunnel insulation layer 150 may include silicon oxide or nitrogen doped silicon oxide.

Figure 4D:
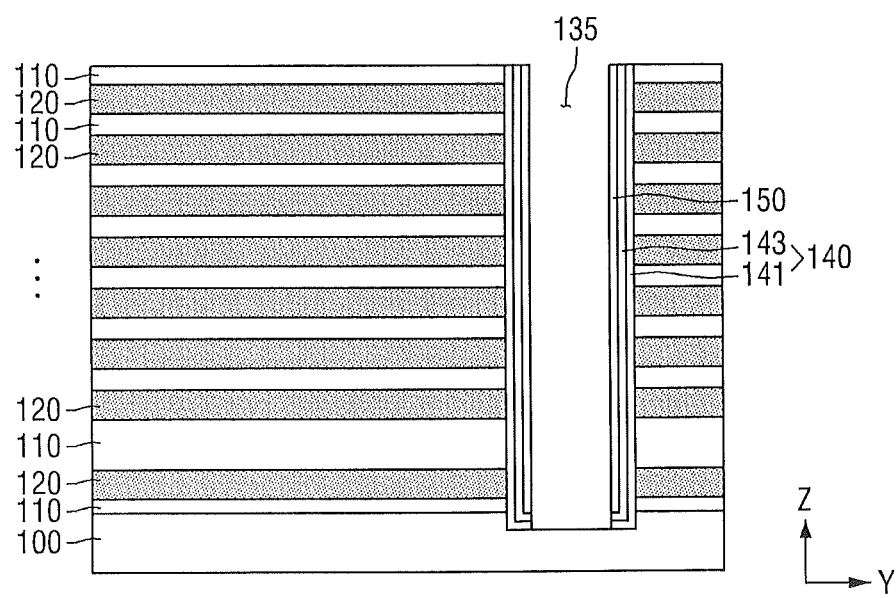

Referring to FIG. 4D, the blocking layer 141, the charge trap layer 143 and the tunnel insulation layer 150, which are formed on the topmost insulation layer 110 and the substrate 100, are removed by, for example, anisotropic etching. Accordingly, the blocking layer 141, the charge trap layer 143 and the tunnel insulation layer 150 are formed on the sidewalls of the channel hole 135 in spacer types, and a portion of the substrate 100 may be exposed.

Figure 4E:
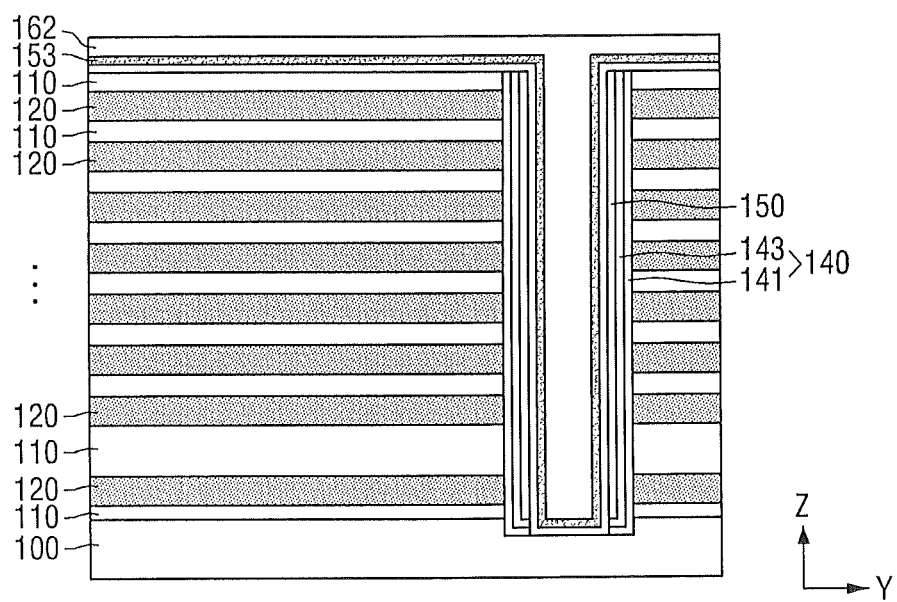

Referring to FIG. 4E, a vertical channel 160, a threshold voltage controlling insulation layer 153 and a filling insulation layer 162 are sequentially formed on the topmost insulation layer 110, the tunnel insulation layer 150 and the substrate 100 exposed in the channel hole 135. The vertical channel 160 may include an undoped polysilicon layer or a polysilicon layer doped with n-type impurity. In addition, the vertical channel 160 may make direct contact with the substrate 100 to be electrically connected. The threshold voltage controlling insulation layer 153 may include a material capable of suppressing an inversion layer from being formed in the vertical channel 160, for example, an aluminum oxide layer. Aluminum atoms contained in the aluminum oxide layer move to the vertical channel 160 to then bond with silicon, thereby forming a negative fixed charge. The negative fixed charge may suppress an inversion layer from being formed in the vertical channel 160.

The threshold voltage controlling insulation layer 153 may make direct contact with the vertical channel 160. In addition, the threshold voltage controlling insulation layer 153 may be completely filled with the filling insulation layer 162.

Figure 4F:
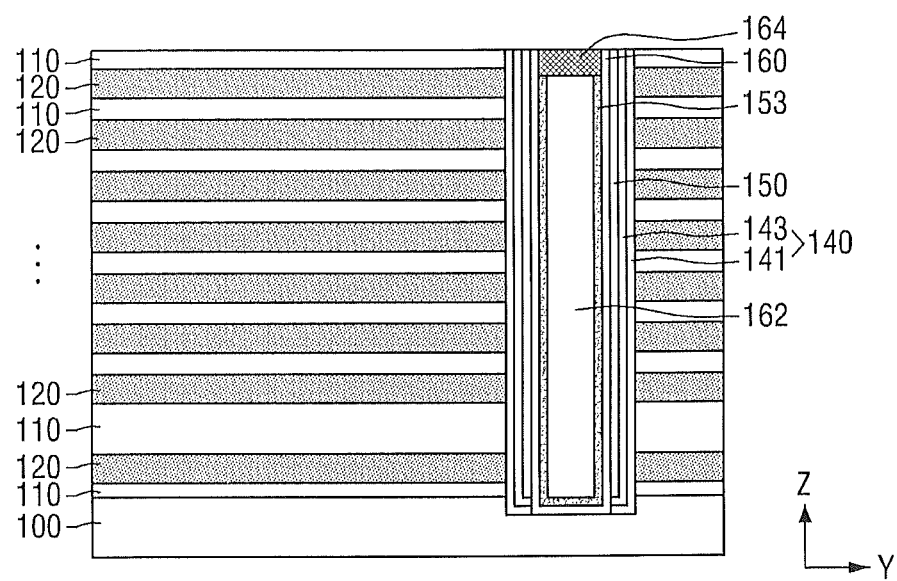

Referring to FIG. 4F, the vertical channel 160, the threshold voltage controlling insulation layer 153 and the filling insulation layer 162, which are formed on the topmost insulation layer 110, are removed by anisotropic etching. Accordingly, the vertical channel 160, the threshold voltage controlling insulation layer 153 and the filling insulation layer 162 may be formed on the tunnel insulation layer 150 and the substrate 100 in the channel hole 135. Thereafter, the anisotropic etching is additionally performed to remove a portion of the filling insulation layer 162 in the channel hole 135. A channel pad 164 filling an upper portion of the channel hole 135 may be formed on the sidewalls of the threshold voltage controlling insulation layer 153 and the filling insulation layer 162. The channel pad 164 may include a conductive material, such as copper (Cu), tungsten (W), or aluminum (Al).

Figure 4G:
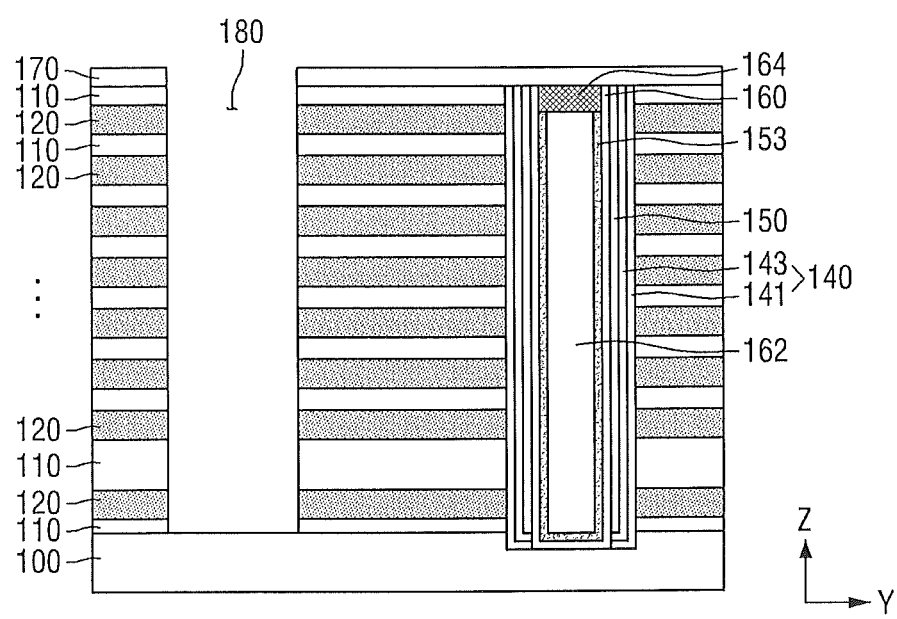

Referring to FIG. 4G, a first interlayer dielectric layer 170 is formed on the channel pad 164, and the first interlayer dielectric layer 170, the plurality of insulation layers 110 and the sacrificial layers 120, which are disposed between adjacent vertical channels 160, may be anisotropically etched, thereby forming a trench 180 exposing the substrate 100. The forming of the trench 180 may include forming a second mask pattern 172 on the first interlayer dielectric layer 170 and forming the trench 180 by anisotropically etching using the second mask pattern 172 as an etch mask until a top surface of the substrate 100 is exposed, the trench 180 vertically passing through the plurality of insulation layers 110 and the sacrificial layers 120 and extending in the first direction X. Side surfaces of the first interlayer dielectric layer 170, the plurality of insulation layers 110 and the sacrificial layers 120 may be exposed in the trench 180. The second mask pattern 172 may include photoresist. The second mask pattern 172 may be removed in a later process.

Figure 4H:
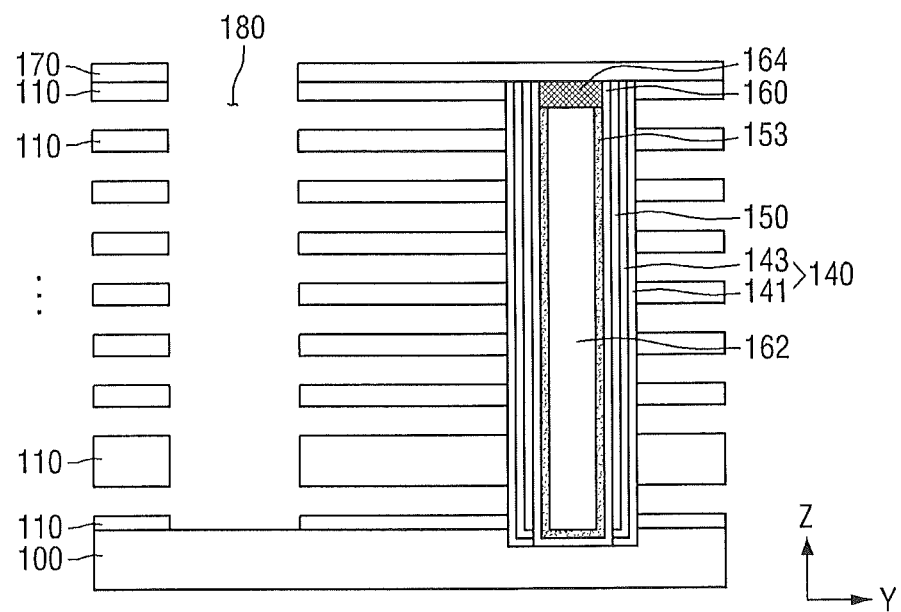

Referring to FIG. 4H, the plurality of sacrificial layers 120 exposed on the sidewalls of the trench 180 are removed. Accordingly, the charge storage layer 140 may be exposed in regions from which the plurality of sacrificial layers 120 are removed. When the plurality of sacrificial layers 120 include silicon nitride or silicon oxynitride, they may be removed using an etching solution containing phosphoric acid.

Figure 4I:
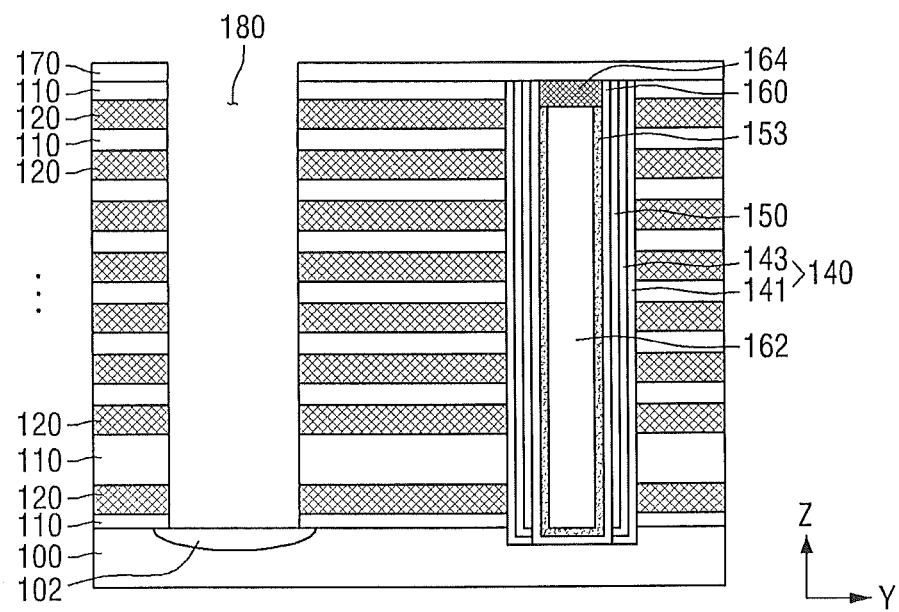

Referring to FIG. 4I, a conductive material is applied to the regions from which the plurality of sacrificial layers 120 are removed to form a plurality of gate electrodes 125. The conductive material may include a metal, metal silicide or a combination thereof. For example, the conductive material may include tungsten, aluminum, copper, or metal silicide.

Thereafter, high-concentration impurity ions may be provided to the substrate 100 exposed in the trench 180, thereby forming impurity regions 102. For example, the providing of the high-concentration impurity ions may include implanting n-type impurity ions, such as phosphorus (P) or arsenic (As) into the substrate 100 on a bottom of the trench 180.

Figure 4J:
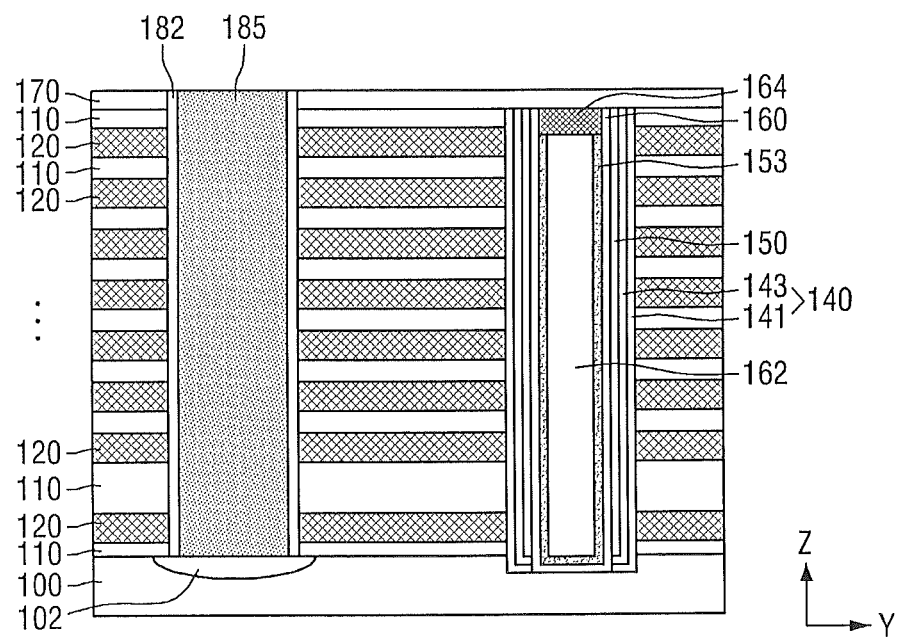

Referring to FIG. 4J, an insulation spacer 182 is formed on inner walls of the trench 180. For example, the forming of the insulation spacer 182 may include forming an insulating material on the sidewalls of the trench 180, the substrate 100 exposed on a bottom of the trench 180 and on the first interlayer dielectric layer 170, and removing the insulating material by performing an anisotropic etching process to expose a top surface of the substrate 100 on the bottom of the trench 180.

Thereafter, a common source line 185 filling the trench 180 is formed on the insulation spacer 182. For example, the forming of the common source line 185 may include forming a conductive material on the entire surface of the insulation spacer 182, the substrate 100 exposed on the bottom of the trench 180 and the first interlayer dielectric layer 170 and then planarizing the conductive material to expose a top surface of the first interlayer dielectric layer 170. The common source line 185 may be electrically connected to the impurity regions 102 of the substrate 100 and may extend in the first direction X. The common source line 185 may include a metal, metal silicide or a combination thereof. For example, the common source line 185 may include tungsten, aluminum, copper, or metal silicide.

Figure 4K:
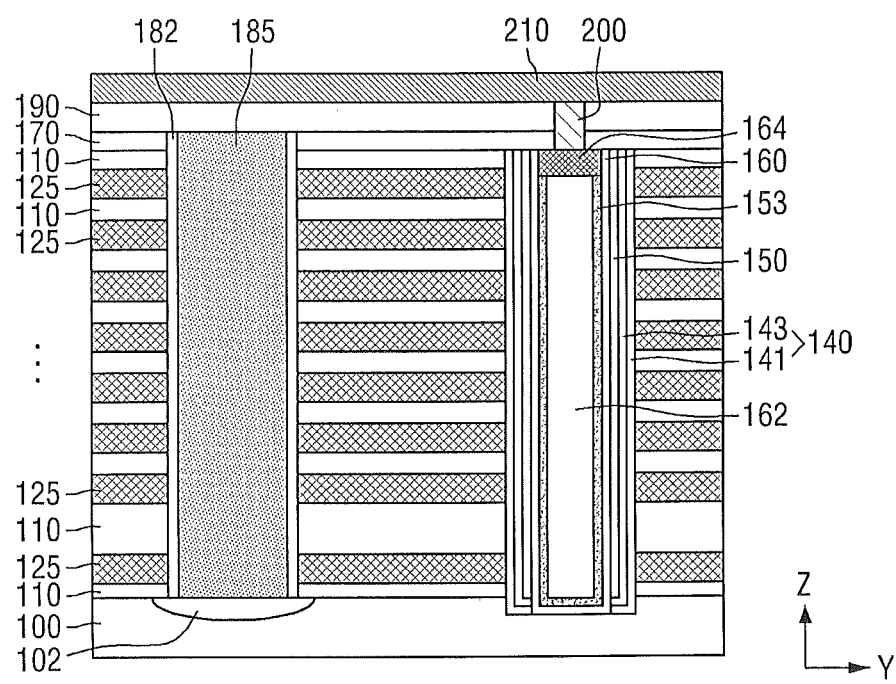

Referring to FIG. 4K, a second interlayer dielectric layer 190 is formed on the first interlayer dielectric layer 170, the insulation spacer 182 and the common source line 185, and a contact pad 200 is formed, the contact pad 200 passing through the first interlayer dielectric layer 170 and the second interlayer dielectric layer 190 and electrically connected to the channel pad 164.

Thereafter, a bit line 210 for connection of the contact pad 200 may be formed on the second interlayer dielectric layer 190. The bit line 210 may be shaped as a line extending in the second direction Y. The contact pad 200 and the bit line 210 may include a conductive material, such as copper (Cu), tungsten (W), or aluminum (Al).

In the method of manufacturing the semiconductor memory device having a vertical channel, the threshold voltage controlling insulation layer 153 is formed between the vertical channel 160 and the filling insulation layer 162, thereby increasing a threshold voltage of the semiconductor memory device. Accordingly, a program margin of the semiconductor memory device can be improved.

Hereinafter, an experimental example for investigating effects of a threshold voltage controlling insulation layer on a threshold voltage of a semiconductor memory device will be described with reference to FIG. 5.

Figure 5:
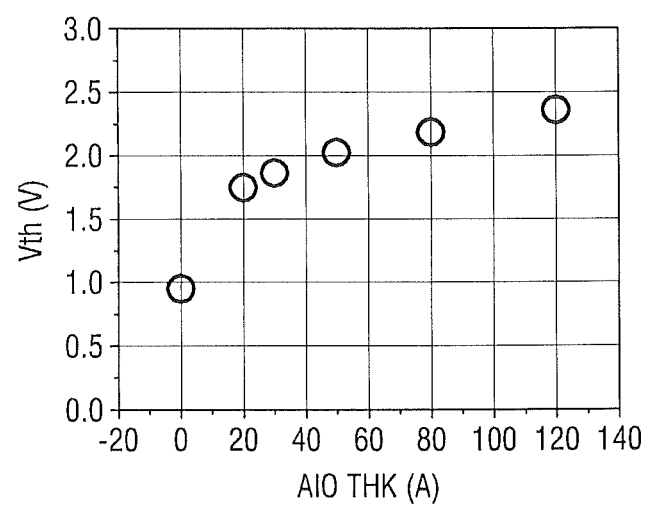
FIG. 5 is a graph illustrating a change in the threshold voltage of a semiconductor device based on the thickness of a threshold voltage controlling insulation layer.

FIG. 5 is a graph illustrating a change in the threshold voltage of a semiconductor device based on the thickness of a threshold voltage controlling insulation layer.

In the graph shown in FIG. 5, the X axis indicates the thickness of an aluminum oxide layer ($Al_xO_y$) and the Y axis indicates the threshold voltage (Vth) of a semiconductor memory device. As confirmed from the graph shown in FIG. 5, the greater the thickness of the aluminum oxide layer used as the threshold voltage controlling insulation layer 153, the higher the threshold voltage of the semiconductor memory device.

Figure 6A:
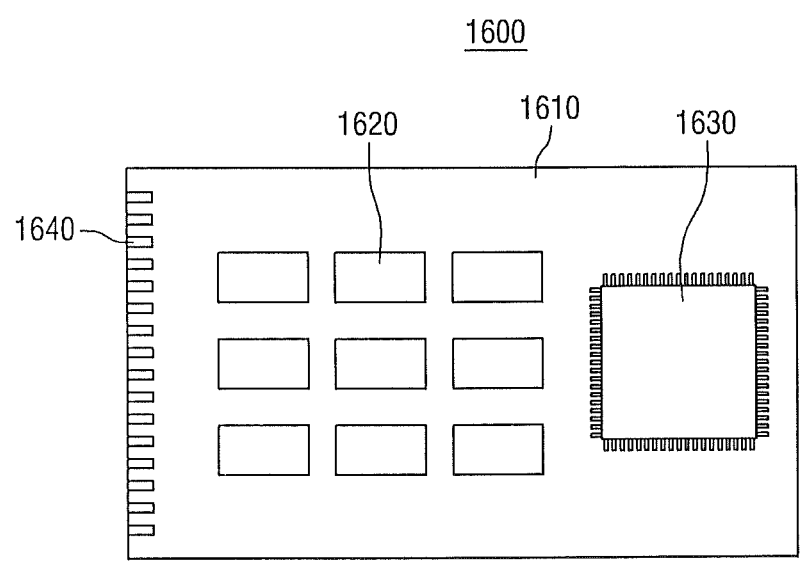
FIG. 6A is a conceptual diagram illustrating semiconductor modules according to some embodiments of the inventive concept and FIGS. 6B and 6C are conceptual block diagrams illustrating electronic systems according to some embodiments of the inventive concept.

FIG. 6A is a conceptual diagram illustrating semiconductor modules according to some embodiments of the inventive concept.

Referring to FIG. 6A, a semiconductor module 2200 may include a processor 2220 and semiconductor devices 2230 mounted on a module substrate 2210. The processor 2220 or the semiconductor devices 2230 may include a semiconductor device 1000 according to various embodiments of the inventive concept. Input/output terminals 2240 may be arranged along at least one side of the module substrate 2210.

Figure 6B:
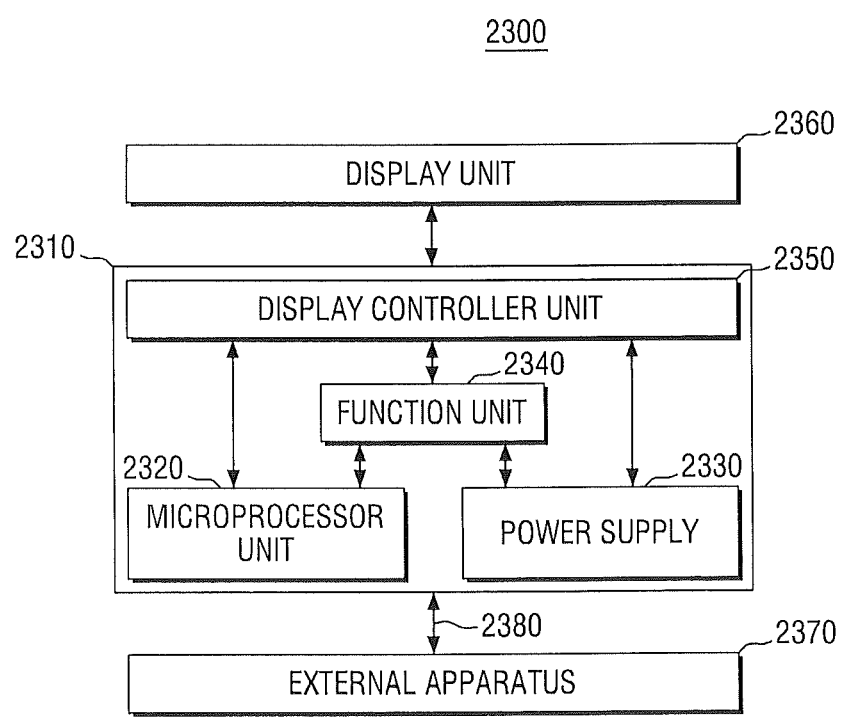
Figure 6C:
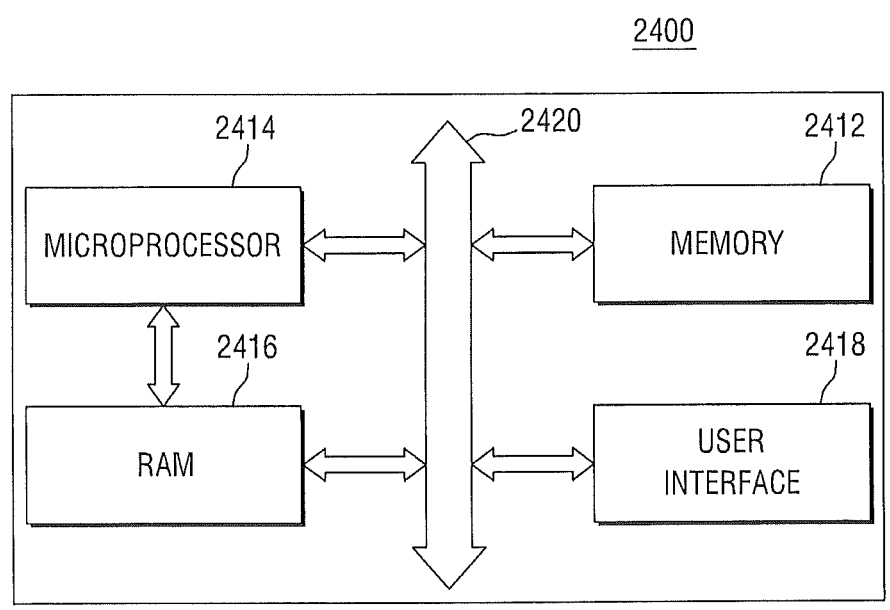

FIGS. 6B and 6C are conceptual block diagrams illustrating electronic systems according to some embodiments of the inventive concept.

Referring to FIG. 6B, an electronic system 2300 according to some embodiments of the inventive concept may include a body 2310, a display unit 2360, and an external device 2370.

The body 2310 may include a micro processor unit 2320, a power supply 2330, a function unit 2340, and/or a display control unit 2350. The body 2310 may include a system board or a mother board having a printed circuit board (PCB), and/or a case. The micro processor unit 2320, the power supply 2330, the function unit 2340, and the display control unit 2350 may be mounted on a top surface of or disposed in the body 2310. The display unit 2360 may be disposed on the top surface of the body 2310 or inside/outside the body 2310.

The display unit 2360 may display an image processed by the display control unit 2350. For example, the display unit 2360 may be a liquid crystal display (LCD), an active matrix organic light emitting diode (AMOLED), or other types of display panels. The display unit 2360 may include a touch screen. Therefore, the display unit 2360 may have input/output functions.

The power supply 2330 may supply a current or a voltage to the micro processor unit 2320, the function unit 2340, the display control unit 2350, and so on. The power supply 2330 may include a charge battery, a socket for a battery, or a voltage/current converter.

The micro processor unit 2320 may be supplied with a voltage from the power supply 2330 and may control the function unit 2340 and the display unit 2360. For example, the micro processor unit 2320 may include a central processing unit (CPU) or an application processor (AP).

The function unit 2340 may perform various functions of the electronic system 2300. For example, the function unit 2340 may include a touch pad, a touch screen, a volatile/nonvolatile memory, a memory card controller, a camera, a light, an audio and motion picture playback processor, a wireless transceiving antenna, a speaker, a mike, an USB port, or other units of various functions.

The micro processor unit 2320 or the function unit 2340 may include the semiconductor device 1000 according to an exemplary embodiment of the inventive concept.

Referring to FIG. 6C, the electronic system 2400 according to some embodiments of the inventive concept may include a microprocessor 2414 performing data communication through a bus 2420, a memory system 2412 and a user interface 2418. The microprocessor 2414 may include a CPU or an AP. The electronic system 2400 may further include a random access memory (RAM) 2416 directly communicating with the microprocessor 2414. The microprocessor 2414 and/or the RAM 2416 may be assembled in a single package. The user interface 2418 may be used in inputting information to the electronic system 2400 or in outputting information from the electronic system 2400. For example, the user interface 2418 may include a touch pad, a touch screen, a keyboard, a mouse, a scanner, a voice detector, a cathode ray tube (CRT) monitor, an LCD, an AMOLED, a plasma display panel (PDP), a printer, a light, or other various types of input/output devices. The memory system 2412 may store codes for operation of the microprocessor 2414, data processed by the microprocessor 2414, or externally input data. The memory system 2412 may include a memory controller, a hard disk, or a solid state drive (SSD). The microprocessor 2414, the RAM 2416, and/or the memory system 2412 may include the semiconductor device 1000 according to the embodiment of the inventive concept.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor memory device comprising:
   insulation layers and gate electrodes alternately stacked on a substrate;
   a vertical channel vertically passing through the insulation layers and the gate electrodes; and
   a threshold voltage controlling insulation layer, a tunnel insulation layer and a charge storage layer disposed between the vertical channel and the gate electrodes,
   wherein the threshold voltage controlling insulation layer is disposed between the charge storage layer and the vertical channel and comprises a material configured to suppress an inversion layer from being formed in the vertical channel; and
   wherein the tunnel insulation layer comprises a first gate insulation layer formed in contact with one surface of the threshold voltage controlling insulation layer and a second gate insulation layer formed in contact with another surface of the threshold voltage controlling insulation layer.

2. The semiconductor memory device of claim 1, wherein the threshold voltage controlling insulation layer comprises an aluminum oxide layer.

3. The semiconductor memory device of claim 1, wherein the tunnel insulation layer comprises silicon oxide or silicon oxynitride.

4. The semiconductor memory device of claim 1, wherein the vertical channel comprises polysilicon.

5. The semiconductor memory device of claim 1, wherein the vertical channel is formed in contact with the first gate insulation layer or the second gate insulation layer.

6. The semiconductor memory device of claim 1, wherein the charge storage layer comprises a charge trap layer and a blocking layer.

7. A semiconductor memory device comprising:
   insulation layers and gate electrodes alternately stacked on a substrate;
   a vertical channel layer vertically passing through the insulation layers and the gate electrodes;
   a tunnel insulation layer and a charge storage layer disposed between the vertical channel layer and the gate electrodes;
   a filling insulation layer filling the inside of the vertical channel layer; and
   a threshold voltage controlling insulation layer disposed between the filling insulation layer and the vertical channel layer,
   wherein the threshold voltage controlling insulation layer comprises a material configured to suppress an inversion layer from being formed in the vertical channel layer;
   wherein the vertical channel layer extends through the insulation layers and the gate electrodes to directly contact the substrate.

8. The semiconductor memory device of claim 7, wherein the threshold voltage controlling insulation layer comprises an aluminum oxide layer.

9. The semiconductor memory device of claim 7, wherein the tunnel insulation layer comprises silicon oxide or silicon oxynitride.

10. The semiconductor memory device of claim 7, wherein the vertical channel layer comprises polysilicon.

11. The semiconductor memory device of claim 7, wherein the vertical channel layer makes direct contact with the threshold voltage controlling insulation layer.

12. The semiconductor memory device of claim 7, wherein the vertical channel layer has a cylindrical shape.

13. The semiconductor memory device of claim 7, wherein the charge storage layer comprises a charge trap layer and a blocking layer.

14. A semiconductor memory device, comprising:
    insulation layers and gate electrodes alternatively stacked on a substrate;
    a vertical channel layer that extends through the insulation layers and the gate electrodes;
    a tunnel insulation layer, a charge storage layer, and a threshold voltage controlling insulation layer disposed on a sidewall of the vertical channel layer;
    wherein the threshold voltage controlling insulation layer is configured to suppress an inversion layer from being formed in the vertical channel layer; and
    wherein the vertical channel layer extends through the insulation layers and the gate electrodes to directly contact the substrate;
    wherein the sidewall of the vertical channel layer has first and second opposing surfaces
    wherein the tunnel insulation layer and the charge storage layer are disposed on the first surface of the sidewall of the vertical channel layer; and
    wherein the threshold voltage controlling insulation layer is disposed on the second surface of the sidewall of the vertical channel layer.

15. The semiconductor memory device of claim 14, wherein the threshold voltage controlling insulation layer is disposed directly on the second surface of the sidewall of the vertical channel layer.

* * * * *